United States Patent [19]

Birrittella

[11] Patent Number: 5,177,380
[45] Date of Patent: Jan. 5, 1993

[54] ECL LATCH WITH SINGLE-ENDED AND DIFFERENTIAL INPUTS

[75] Inventor: Mark S. Birrittella, Chippewa Falls, Wis.

[73] Assignee: Cray Research, Inc., Eagan, Minn.

[21] Appl. No.: 867,282

[22] Filed: Apr. 9, 1992

Related U.S. Application Data

[63] Continuation of Ser. No. 707,259, May 23, 1992, abandoned, which is a continuation of Ser. No. 477,588, Feb. 9, 1990, abandoned.

[51] Int. Cl.$^5$ ......................................... H03K 19/086
[52] U.S. Cl. ................................. 307/455; 307/272.2; 307/443
[58] Field of Search ............... 307/443, 475, 455, 355, 307/456, 361, 360, 362, 363, 270, 264, 272.2

[56] References Cited

U.S. PATENT DOCUMENTS

| | | | |
|---|---|---|---|
| 3,953,746 | 4/1976 | Fett . | |
| 4,408,134 | 10/1983 | Allen | 307/455 X |
| 4,546,272 | 10/1985 | Suzuki et al. | 307/455 |
| 4,593,457 | 6/1986 | Birrittella | 357/34 X |
| 4,644,194 | 2/1987 | Birrittella et al. | 307/475 |
| 4,649,411 | 3/1987 | Birrittella | 357/36 |
| 4,661,725 | 4/1987 | Chantepie | 307/450 |
| 4,714,841 | 12/1987 | Shoji et al. | 307/455 |
| 4,808,851 | 2/1989 | Chantepie | 307/450 |
| 4,864,166 | 9/1989 | Gloaguen | 307/455 |
| 4,928,024 | 5/1990 | Shimotsuhama et al. | 307/455 |
| 4,963,767 | 10/1990 | Sinh | 307/455 |

FOREIGN PATENT DOCUMENTS 0341732  11/1989  European Pat. Off. .

OTHER PUBLICATIONS

*IBM Technical Disclosure Bulletin*, vol. 32, No. 1, Jun. 1989, (New York, US), "Implementation of an Over-Writing ECL Logic", pp. 152–153.
*Radio Fernsehen Elektronik*, vol. 26, No. 1, Jan. 1977, M. Auer et al.: "Complexe ECL-Schaltkreise" pp. 10–24.

Primary Examiner—David Hudspeth
Attorney, Agent, or Firm—Merchant, Gould, Smith, Edell, Welter & Schmidt

[57] ABSTRACT

An ECL circuit is capable of simultaneously responding to single-ended and differential inputs. The ECL circuit comprises a single-ended input, a differential input, logic responsive to the single-ended and differential inputs for determining a digital output state, and an output for communicating the output state to external devices. Each input, i.e., the single-ended input and the two complementary portions of the differential input, provide a base voltage for a control transistor. In order to allow the single-ended input to override the differential input, the differential input has half the voltage swing of the single-ended input and the high level of the differential input is halfway between the high and low levels of the single-ended input. In this way, an active single-ended input will exert more control over the current paths than the differential input. When the single-ended input is inactive, the differential input will exert control over the current paths.

4 Claims, 2 Drawing Sheets

ECL LATCH WITH SINGLE-ENDED AND DIFFERENTIAL INPUTS

This is a continuation, of application Ser. No. 07/707,259, filed May 23, 1991, abandoned, which is a continuation application of Ser. No. 07/477,588 filed Feb. 9, 1990, abandoned.

BACKGROUND OF THE INVENTION

1. Field of the Invention

The present invention relates generally to the field of Emitter Coupled Logic (ECL) circuits, and specifically to an ECL circuit accepting single-ended and differential inputs.

2. Description of Related Art

As is well known in the art, a basic ECL circuit consists of a differential amplifier. The differential amplifier consists of two parallel current paths, each controlled by an input level. Each input level provides a base voltage for a transistor controlling the current path. The digital state of the differential amplifier is determined by which of the two paths pass the most current.

There are two ways in which a ECL circuit is typically configured. The most common configuration is where one input to the differential amplifier is held constant at a fixed intermediate voltage, thereby allowing the other input to control the state of the differential amplifier (i.e., single-ended operation). In an alternative configuration, each of the complimentary outputs from a previous gate may be connected as complimentary inputs to the differential amplifier (i.e., differential operation).

SUMMARY OF THE INVENTION

To overcome limitations in the prior art, the present invention provides an ECL circuit capable of simultaneously responding to single-ended and differential inputs. The ECL circuit comprises a single-ended input, a differential input, logic means responsive to the single-ended and differential inputs for determining an output state, and output means for communicating the output state to external devices. Each input, i.e., the single-ended input and the two complementary portions of the differential input, provides a base voltage for a control transistor. In order to allow the single-ended input to override the differential input, the differential input has half the voltage swing of the single-ended input and the high level of the differential input is halfway between the high and low levels of the single-ended input. In this way, an active single-ended input will exert more control over the current paths than the differential input. When the single-ended input is inactive, the differential input will exert control over the current paths.

BRIEF DESCRIPTION OF THE DRAWINGS

Referring now to the drawings, in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

In the preferred embodiment of the present invention, an ECL circuit is controlled by single-ended and differential inputs, each input providing a base voltage for a control transistor in a current switch. The inputs are comprised of a single-ended input and the two complementary portions of a differential input. In order to allow the single-ended input to override the differential input when the single-ended input is active, the differential input has half the voltage swing of the single-ended input and the high level of the differential input is halfway between the high and low levels of the single-ended input. In this way, an active single-ended input will exert control over the current switch. When the single-ended input is inactive, the differential input will exert control over the current switch.

Figure 1:
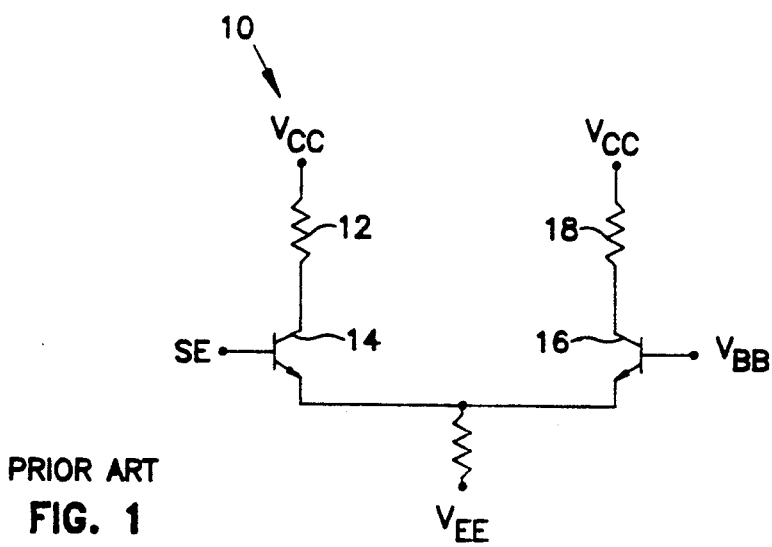
FIG. 1 is a schematic diagram of a prior art ECL current switch.

FIG. 1 is a schematic diagram of a prior art ECL switch 10. A logic operation in the ECL switch 10 consists of steering the current through either of two transistors, 14 or 16, to $V_{CC}$. The state of the switch 10 is determined by the resultant voltage drop across resistors 12 or 18. The net voltage swing is determined by the values of the resistors 12 and 18 and the magnitude of the current.

When the two base voltages SE and $V_{BB}$ are equal, the current is divided equally between transistors 14 and 16. Assuming $V_{BB}$ is held at a fixed intermediate voltage, then an increase in voltage SE by some fixed amount causes essentially all the current to flow through transistor 14. A decrease in voltage SE by the same fixed amount causes essentially all the current to flow through transistor 16. The voltage swing required to control the switch 10 is relatively small and typically is centered about $V_{BB}$.

Figure 2:
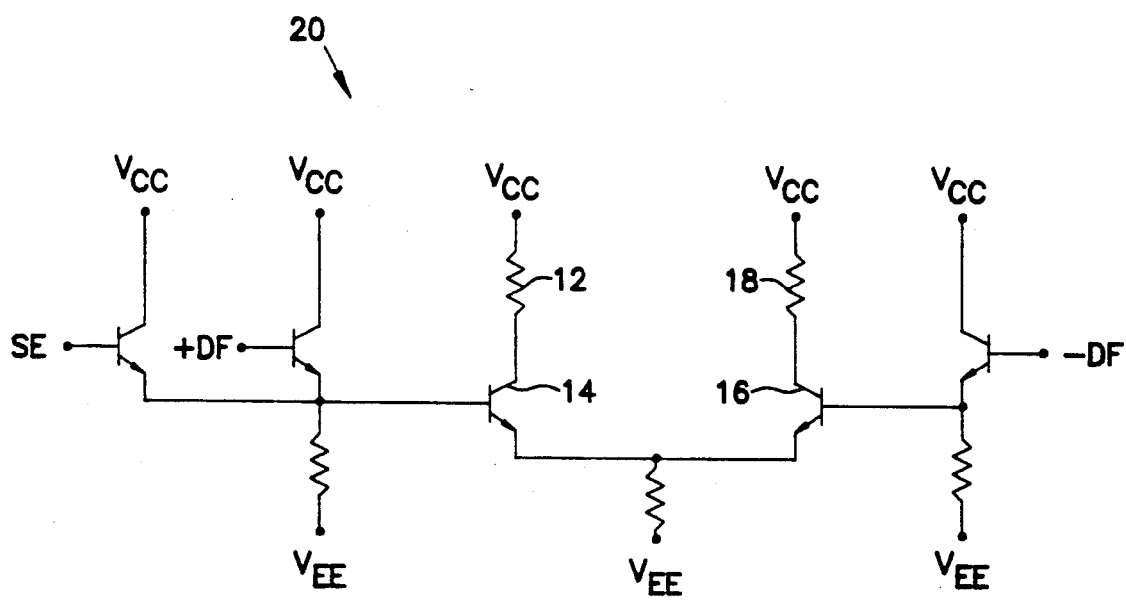
FIG. 2 is a schematic diagram of an ECL current switch using single-ended and differential signals.

FIG. 2 is a schematic diagram of an ECL current switch 20 according to a preferred embodiment of the present invention. A logic operation in the ECL switch 20 consists of steering the current through one of the transistors, 14 or 16, to $V_{CC}$.

The SE input is single-ended varying from $-1.7$ volts to $-0.9$ volts. The $+DF$ and $-DF$ inputs are complementary portions of a differential input varying from $-1.7$ volts to $-1.3$ volts.

When SE is $-0.9$ volts, then essentially all the current flows through transistor 14 to $V_{CC}$, regardless of the values for $+DF$ and $-DF$. When SE is $-1.7$ volts, then essentially all the current flows through either transistor 14 or 16 to $V_{CC}$ depending upon the relative values of $+DF$ and $-DF$.

When $+DF$ is $-1.3$ volts, then $-DF$ is $-1.7$ volts and essentially all the current flows through transistor 14 to $V_{CC}$. When $+DF$ is $-1.7$ volts, then $-DF$ is $-1.3$ volts and essentially all the current flows through transistor 16 to $V_{CC}$.

Figure 3:
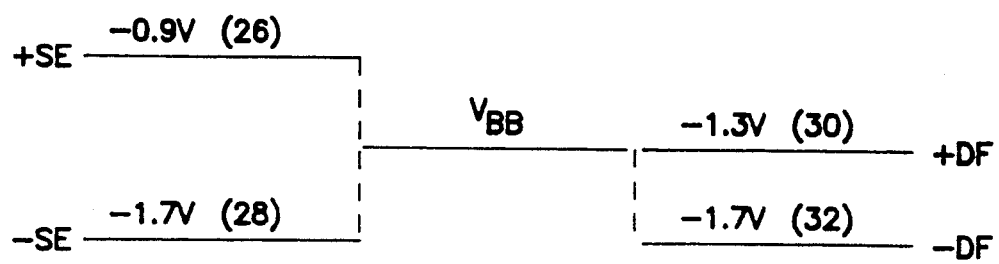
FIG. 3 is a waveform diagram showing typical signal voltage levels according to the embodiment shown in FIG. 2.

FIG. 3 is a waveform diagram of the voltage levels of the inputs to the ECL switch 20 of FIG. 2. Traces '+SE' and '−SE' show that single-ended input 'SE' has a voltage swing of approximately 0.8 volts ranging from −0.9 volts (26) to −1.7 volts (28), centered about a $V_{BB}$ value of −1.3 volts. Traces '+DF' and '−DF' show the differential input 'DF' has a voltage swing of approximately 0.4 volts ranging from −1.3 volts (30) to −1.7 volts (32).

Those skilled in the art will recognize that other voltage levels can be used without departing from the scope of the invention.

Figure 4:
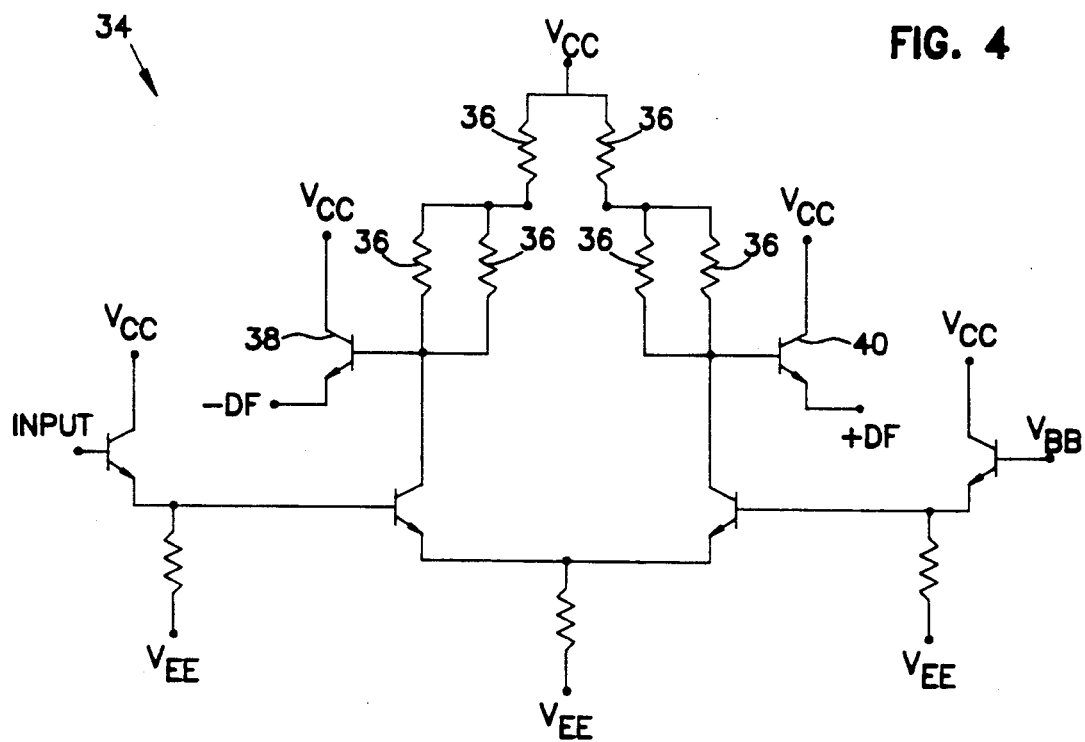
FIG. 4 is a schematic diagram of an ECL circuit capable of supplying the voltage levels of FIG. 3.

FIG. 4 is a schematic diagram of an ECL circuit 34 that provides the voltage levels for differential inputs +DF and −DF. In order to allow the single-ended input to override the differential input when the single-ended input is active, the differential input is set at half the voltage swing of the single-ended input and the high level low levels of the single-ended input. Outputs '+DF' and '−DF' are the complementary portions of a differential input and have a voltage swing of approximately 0.4 volts ranging from −1.3 volts to −1.7 volts. The output low voltage is dependent upon the value of the resistors 36 through which the current source must flow. Thus, the output low voltage level can be selected by choosing appropriate values for the resistors 36. Those skilled in the art will recognized that the resistors 36 can be selected in many different combinations, each of which yields the correct amount of total resistance between the base of output transistor 38 or 40 and $V_{CC}$.

Figure 5:
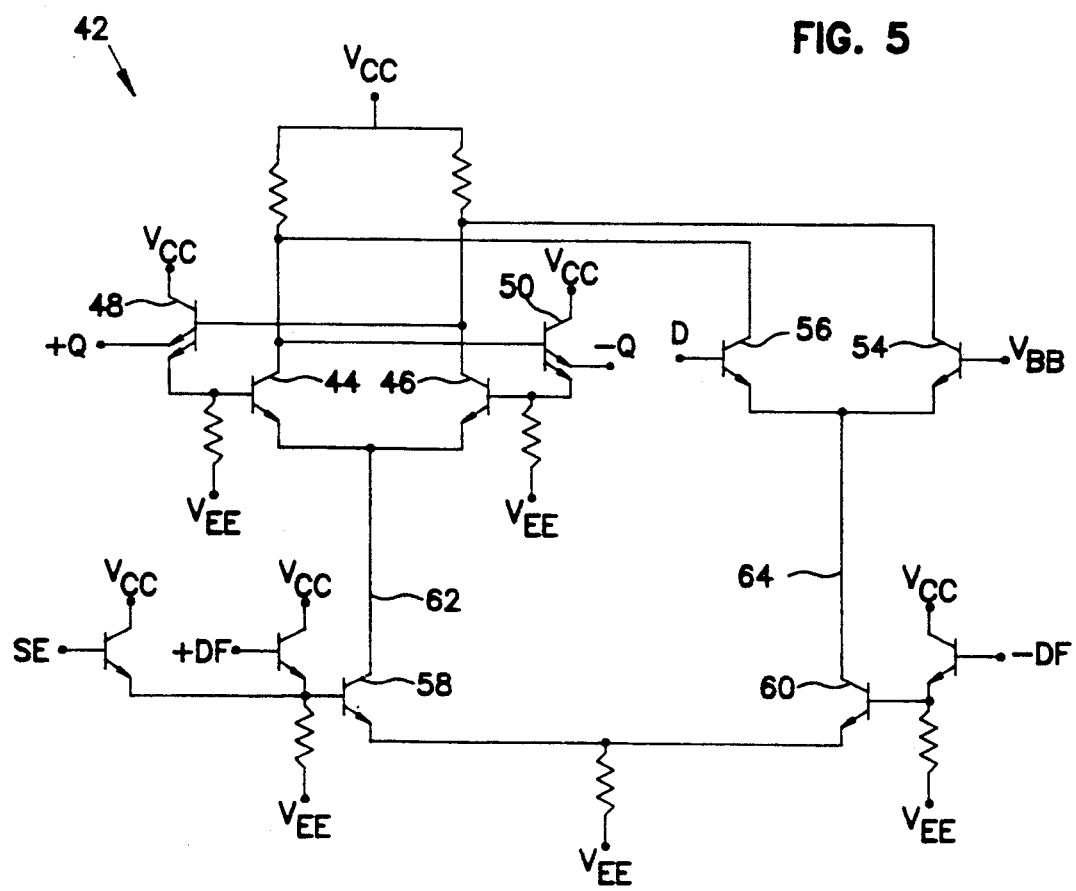
FIG. 5 is a schematic diagram of an ECL latch capable of responding simultaneously to single-ended and differential inputs.

FIG. 5 is a schematic diagram of an ECL latch 42 according to a preferred embodiment of present invention. Transistors 44 and 46 comprise a first differential amplifier, which is cross-coupled through transistors 48 and 50 to form a latch element. Transistors 54 and 56 comprise a second differential amplifier, the state of which is controlled by the data input 'D' connected to the base of transistor 56. Transistors 58 and 60 form a third differential amplifier, which controls current flow in conductors 62 and 64. The third differential amplifier is controlled by a single-ended input 'SE' and differential inputs '−DF' and '+DF'.

When either SE or +DF are high, current flows through conductor 62 and the circuit is in a "latch" condition. Outputs +Q and −Q present data based on the prior state of the latch circuit.

When both SE and +DF are low, current flows through conductor 64 and the circuit is in an "open" condition. Outputs +Q and −Q present data based on the state of the input D.

In summary, a ECL circuit has been described which is capable of simultaneously responding to single-ended and differential inputs. The ECL circuit comprises a single-ended input, a differential input, logic means responsive to the single-ended and differential inputs for determining a digital output state, and output means for communicating the output state to external devices. The single-ended input and the two complementary portions of the differential input each provide a base voltage for a control transistor in a current switch. In order to allow the single-ended input to override the differential inputs, the differential input has half the voltage swing of the single-ended input and the high level of the differential input is halfway between the high and low levels of the single-ended input. In this way, an active single-ended input will exert control over the current switch. When the single-ended input is inactive, the differential input will exert control over the current switch.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An ECL latch, comprising:
   (a) data input means for receiving a data signal;
   (b) single-ended input means for receiving a single-ended signal;
   (c) differential input means for receiving a differential signal;
   (d) data storage means connected to said data input means, differential input means, and single-ended input means for storing a logic state of said data signal in response to said single-ended signal so that an active said single-ended signal overrides said differential signal and determines said logic state according to said data input signal, and wherein said differential signal determines said logic state according to said data input state when said single-ended signal is inactive; and
   (e) output means connected to said data storage means for communicating said stored logic level to external devices.

2. An ECL device, comprising:
   a first transistor and a second transistor connected as a differential pair;
   differential input means including a third transistor and a fourth transistor for receiving a differential signal having a high and low level and for driving said first transistor and secondary transistor; and
   single ended input means including a fifth transistor connected in parallel to said third transistor for receiving a single-ended signal having a high level that is higher than said high level of said differential signal and a low level that is lower than said high level of said differential signal and for driving said first transistor.

3. An ECL device, comprising:
   a first transistor and a second transistor connected as a differential pair;
   first input means for receiving a differential signal, said first input means including a third transistor and a fourth transistor, said fourth transistor for driving said second transistor of said differential pair;
   second input means including a fifth transistor for receiving a single-ended signal, said fifth transistor connected in parallel with said third transistor to drive said first transistor of said differential pair, wherein said single-ended signal has twice the voltage swing of said differential signal,
   said differential pair being responsive to said first and second input means for determining a digital output state, wherein an active said single-ended signal overrides said differential signal and determines said digital output state, and wherein said differential signal determines said digital output state when said single-ended signal is inactive; and
   output means connected to said differential pair for communicating the digital output state to external devices.

4. An ECL logic gate constructed of transistors, each transistor having an emitter, collector and base, comprising:
- a first transistor and a second transistor connected as a differential transistor pair with the emitter of the first transistor connected to the emitter of the second transistor, and with the collector of the first transistor and the collector of the second transistor connected for receiving current from a voltage source;
- a third transistor having its emitter connected to the base of the first transistor and having its collector connected for receiving current from the voltage source;
- a fourth transistor having its emitter connected to the base of the second transistor and having its collector connected for receiving current from the voltage source;
- differential input means connected to the base of the third transistor and the base of the fourth transistor for receiving a differential input signal;
- a fifth transistor also having its emitter connected to the base of the first transistor and having its collector connected for receiving current from the voltage source; and
- single-ended input means connected to the base of the fifth transistor for receiving a single-ended input signal.

* * * * *